(12) United States Patent
Guo

(10) Patent No.: US 9,373,701 B2
(45) Date of Patent: Jun. 21, 2016

(54) METHOD FOR FABRICATING ARRAY SUBSTRATE

(71) Applicant: BEIJING BOE OPTOELECTRONICS TECHNOLOGY CO., LTD., Beijing (CN)

(72) Inventor: Jian Guo, Beijing (CN)

(73) Assignee: BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 14/103,625

(22) Filed: Dec. 11, 2013

(65) Prior Publication Data
US 2014/0187001 A1    Jul. 3, 2014

(30) Foreign Application Priority Data

Dec. 28, 2012  (CN) .............................. 201210589548

(51) Int. Cl.
| H01L 21/00 | (2006.01) |
| H01L 29/66 | (2006.01) |
| H01L 21/28 | (2006.01) |
| H01L 27/12 | (2006.01) |

(52) U.S. Cl.
CPC .... *H01L 29/66765* (2013.01); *H01L 21/28017* (2013.01); *H01L 27/1288* (2013.01)

(58) Field of Classification Search
CPC ..................... H01L 29/66765; H01L 27/1288; H01L 2/280171

USPC ......................................................... 438/158
See application file for complete search history.

(56) References Cited

U.S. PATENT DOCUMENTS

| 8,404,507 B2 * | 3/2013 | Xiao et al. ....................... 438/38 |
| 2007/0273803 A1 * | 11/2007 | Liou et al. ....................... 349/43 |
| 2008/0079010 A1 | 4/2008 | Kim et al. |

(Continued)

FOREIGN PATENT DOCUMENTS

| CN | 1794076 A | 6/2006 |
| CN | 101188243 A | 5/2008 |

(Continued)

OTHER PUBLICATIONS

The State Intellectual Property Office of the People'S Republic of China ("SIPO") (Chinese Language) Office Action issued on May 21, 2014 by SIPO in Chinese Patent Application No. 201210589548. 5; seven (7) pages.

(Continued)

*Primary Examiner* — Reema Patel
*Assistant Examiner* — Syed Gheyas

(57) ABSTRACT

Disclosed is a method for fabricating an array substrate, comprising: forming a pattern layer comprising a gate and a gate connection on a substrate; sequentially forming an insulation layer film and an active layer film on the substrate, and forming a pattern of a gate insulation layer having a first via hole and a pattern of an active layer through a single patterning process, wherein the first via hole is located above the gate connection; sequentially forming a transparent conductive film and a metal film on the substrate, and forming a pattern layer comprising a first electrode and a pattern layer comprising a data line, a source, a drain and a TFT channel through a single patterning process.

7 Claims, 10 Drawing Sheets

(56) References Cited

U.S. PATENT DOCUMENTS

| | | | |
|---|---|---|---|
| 2009/0206339 A1* | 8/2009 | Park et al. | 257/59 |
| 2010/0289977 A1* | 11/2010 | Liu | 349/44 |
| 2010/0301327 A1* | 12/2010 | Kang et al. | 257/43 |
| 2011/0084268 A1* | 4/2011 | Yamazaki et al. | 257/43 |
| 2011/0101335 A1* | 5/2011 | Yamazaki et al. | 257/43 |
| 2012/0138923 A1* | 6/2012 | Hara et al. | 257/43 |
| 2012/0300283 A1* | 11/2012 | Fujiyoshi et al. | 359/290 |
| 2014/0209913 A1 | 7/2014 | Song et al. | |

FOREIGN PATENT DOCUMENTS

| | | |
|---|---|---|
| CN | 102148195 A | 8/2011 |
| CN | 202404339 U | 8/2012 |

OTHER PUBLICATIONS

English Translation of SIPO Office Action of Chinese Patent Application No. 201210589548.5 issued on May 21, 2014; four (4) pages.

English machine translation of Chinese Patent Document No. CN 1794076 A.

English machine translation of Chinese Patent Document No. Cn 102148195 A.

The State Intellectual Property Office of the People'S Republic of China ("SIPO") (Chinese Language) second Office Action issued on Dec. 5, 2014 by SIPO in Chinese Patent Application No. 201210589548.5; four (4) pages.

English Translation of SIPO Office Action of Chinese Patent Application No. 201210589548.5 issued, on two (2) pages.

Third Office Action (Chinese Language) issued by State Intellectual Property Office of the People's Republic of China, in Chinese Patent Application No. 201210589548.5, dated Jun. 11, 2015; 6 pages.

English Translation of Third Office Action issued by State Intellectual Property Office of the People's Republic of China, in Chinese Patent Application No. 201210589548.5, dated Jun. 11, 2015; 5 pages.

English abstract of CN101188243A dated May 28, 2008.

English abstract of CN202404339U dated Aug. 29, 2012.

Fourth Office Action (Chinese Language) issued by State Intellectual Property Office of the People's Republic of China, in Chinese Patent Application No. 201210589548.5, dated Nov. 19, 2015; 4 pages.

English Translation of Fourth Office Action (Chinese Language) issued by State Intellectual Property Office of the Peoples Republic of China, in Chinese Patent Application No. 201210589548.5, dated November 19, 2015; 2 pages.

* cited by examiner

METHOD FOR FABRICATING ARRAY SUBSTRATE

CROSS REFERENCE TO RELATED APPLICATIONS

This application claims priority from Chinese National Application No. 201210589548.5 filed on Dec. 28, 2012, the contents of which are incorporated herein by reference.

FIELD OF THE ART

Embodiments of the invention relate to the field of display technology, more particularly, to a method for fabricating an array substrate.

BACKGROUND

With the ever development of Thin Film Transistor (TFT) display technology, more and more novel technologies are proposed and employed, such as Gate on Array (GOA) technology with high resolution and high aperture ratio. Currently, with respect to TFT-LCD, the fabrication of a conventional Advanced-Super Dimensional Switching (ADS) array substrate generally requires seven patterning processes including a gate metal layer mask, a active layer mask, a gate insulation layer mask, a first electrode layer mask, a source/drain metal layer mask, a passivation layer mask and a second electrode layer mask, and each patterning process respectively comprises film formation, exposing, developing, etching and peeling etc.

However, too many patterning processes will directly increase the product cost while decreasing the production capacity. Therefore, there is a need to further reduce the number of patterning processes.

SUMMARY

An embodiment of the invention provides a method for fabricating an array substrate, which forms a pattern of a gate insulation layer having a via hole and a pattern of an active layer through a single patterning process, and a pattern of a first electrode and a pattern of a data line, a source, a drain through a single patterning process, which reduces the patterning processes, thereby increasing the production capacity and decreasing the cost.

An aspect of the invention provides a method for fabricating an array substrate, comprising: forming a pattern layer comprising a gate and a gate connection on a substrate; sequentially forming an insulation layer film and an active layer film on the substrate done with the previous step, and forming a pattern of a gate insulation layer having a first via hole and a pattern of an active layer through a single patterning process, wherein the first via hole is located above the gate connection; sequentially forming a transparent conductive film and a metal film on the substrate done with the previous step, and forming a pattern layer comprising a first electrode and a pattern layer comprising a data line, a source, a drain and a TFT channel through a single patterning process.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

NUMERAL REFERENCES

Figure 1:
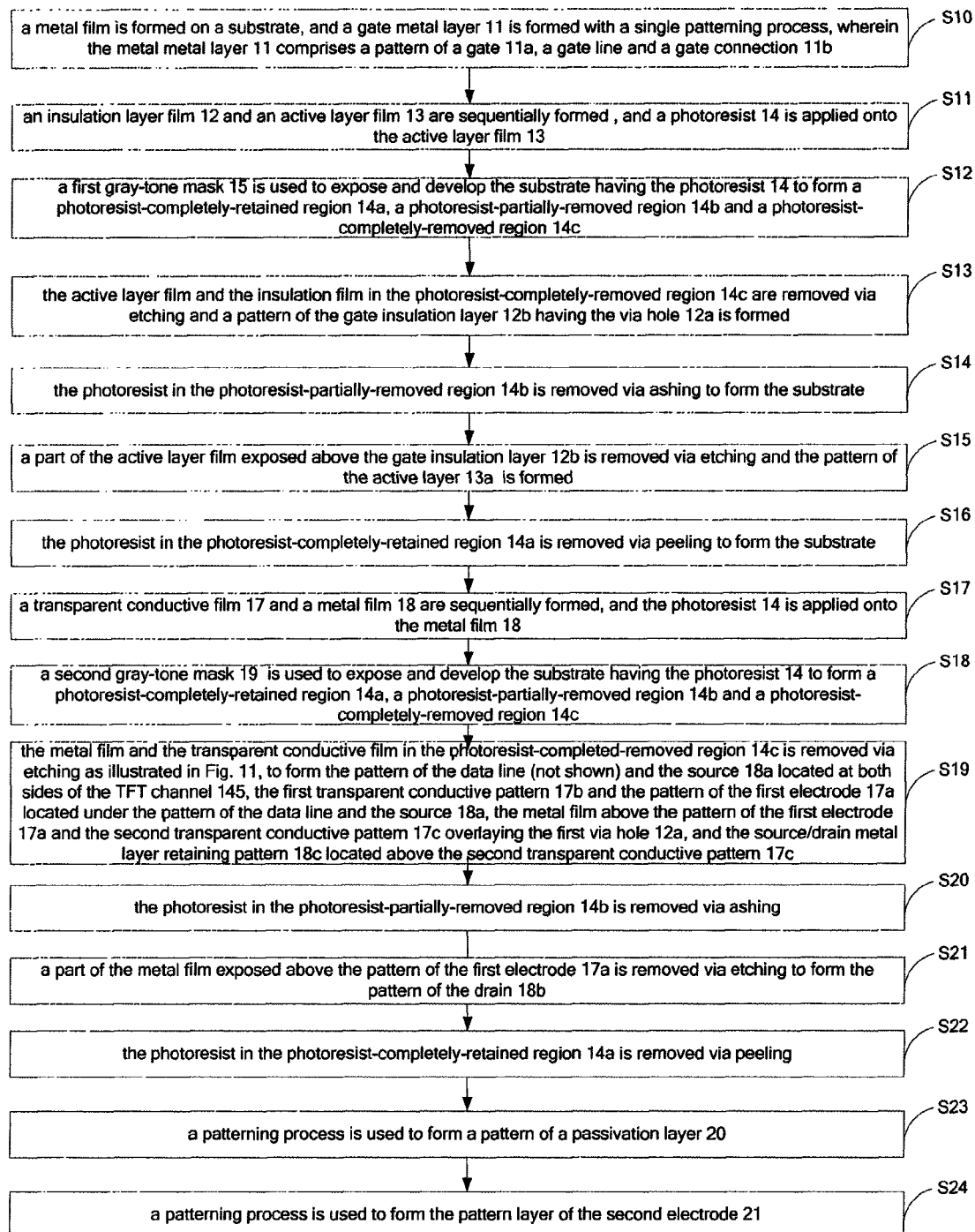
FIG. 1 schematically illustrates a flow chart of a method for fabricating an array substrate in accordance with Embodiment 1 of the invention.

11—gate metal layer
11a—gate
11b—gate connection
12—insulation layer film
12a—first via hole
12b—gate insulation layer
13—active layer film
13a—active layer pattern
13a1—amorphous pattern
13a2—n+ amorphous pattern
14—photoresist
14a—photoresist-completely-retained region
14b—photoresist-partially-removed region
14c—photoresist-completely-removed region 15—first gray-tone mask
15a—opaque portion
15b—semitransparent portion
15c—transparent portion
17—transparent conductive film
17a—a pattern of a first electrode
17b—first transparent conductive pattern
17c—second transparent conductive pattern
18—metal film
18a—source
18b—drain
18c—source/drain metal layer retaining pattern 145—channel 19—second gray-tone mask
20—passivation layer
20a—second via hole
21—second electrode

DETAILED DESCRIPTION

In order to make objects, technical details and advantages of the embodiments of the invention apparent, the technical solutions of the embodiment will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

An embodiment of the invention provides a method for fabricating an array substrate, comprising: forming a pattern layer comprising a gate and a gate connection on a substrate; sequentially forming an insulation layer film and an active layer film on the substrate done with the previous step, and forming a pattern of a gate insulation layer having a first via hole and a pattern of an active layer through a single patterning process, wherein the via hole is located above the gate connection; sequentially forming a transparent conductive film and a metal film on the substrate done with the previous step, and forming a pattern layer comprising a first electrode and a pattern layer comprising a data line, a source, a drain and a TFT channel through a single patterning process; forming a pattern of a passivation layer on the substrate done with the previous step; forming a pattern layer comprising a second electrode on the substrate done with the previous step.

Please note that a typical array substrate generally comprises a pattern of a gate and a gate connection, a pattern of a gate insulation layer having a first via hole, a pattern of an active layer, a pattern of a first electrode, and a pattern of a data line, a source, a drain and a TFT channel. As for an ADS array substrate, it may further comprise a pattern of a passivation layer and a pattern of a second electrode. Moreover, a single patterning process used in all the embodiments of the invention means using a single mask during the patterning.

In the embodiments of the invention, a single patterning process is used to form a pattern of a gate insulation layer having a via hole and a pattern of an active layer, and a single patterning process is used to form a pattern layer comprising a first electrode and a pattern layer comprising a data line, a source and a drain. In comparison with the conventional art which forms the pattern of the gate insulation layer having the first via hole and the pattern of the active layer, and the pattern of the first electrode and the pattern of the data line, the source and the drain respectively by using two patterning processes, the embodiments of the invention reduces the number of patterning processes, thereby improving the production capacity and reducing the cost.

Embodiment 1

Figure 2:
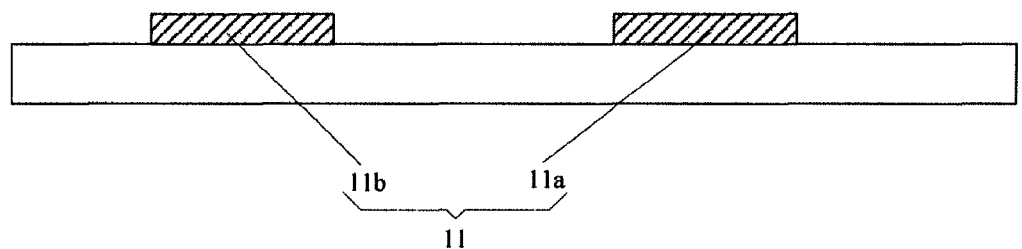
FIG. 2 schematically illustrates a cross section of a substrate having a pattern comprising a gate and a gate connection formed thereon in accordance with Embodiment 1 of the invention.

As illustrated in FIG. 1, a method for fabricating an array substrate comprises the following steps:

S10, a metal film is formed on a substrate, and a gate metal layer 11 as illustrated in FIG. 2 is formed with a single patterning process, wherein the metal layer 11 comprises a pattern of a gate 11a, a gate line (not shown in the figure) and a gate connection 11b.

As an example, a metal film with a thickness of 1000 Å to 7000 Å may be fabricated on a substrate such as a glass substrate using magnetron sputtering. The metal film is generally made of molybdenum, aluminum, nickel aluminum alloy, molybdenum tungsten alloy, chrome or copper, or a combination of any of the above materials. Then a pattern layer of the gate 11a, the gate line (not shown in the figure) and the gate connection 11b is formed on a certain region of the substrate with a patterning process including exposing, developing, etching, peeling and so on by using a mask.

Figure 3:
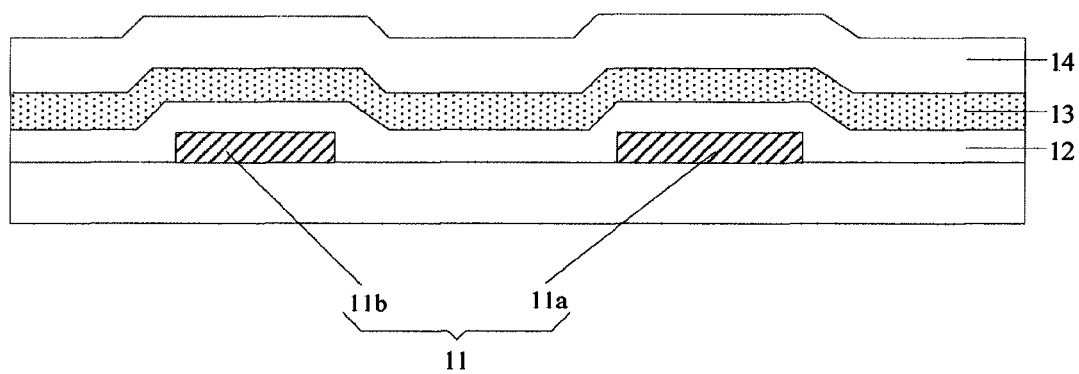
FIGS. 3 to 8 schematically illustrate cross sections of an substrate during the procedure of forming a pattern of a gate insulation layer having a first via hole and a pattern of an active layer in accordance with Embodiment 1 of the invention.

S11, as illustrated in FIG. 3, an insulation layer film 12 and an active layer film 13 are sequentially formed on the substrate done with step S10, and a photoresist 14 is applied onto the active layer film 13.

As an example, an insulation layer film with a thickness of 1000 Å to 6000 Å may be formed on the substrate having the pattern layer of the gate 11a, the gate line and the gate connection 11b by using Chemical Vapor Deposition (CVD). For example, the insulation layer film is made of silicon nitride; it may also be silicon oxide or silicon oxynitride. Then a metal oxide semiconductor film with a thickness of 1000 Å to 6000 Å is deposited on the substrate also by using CVD. Then a layer of photoresist 14 is applied to the metal oxide semiconductor film.

Figure 4:
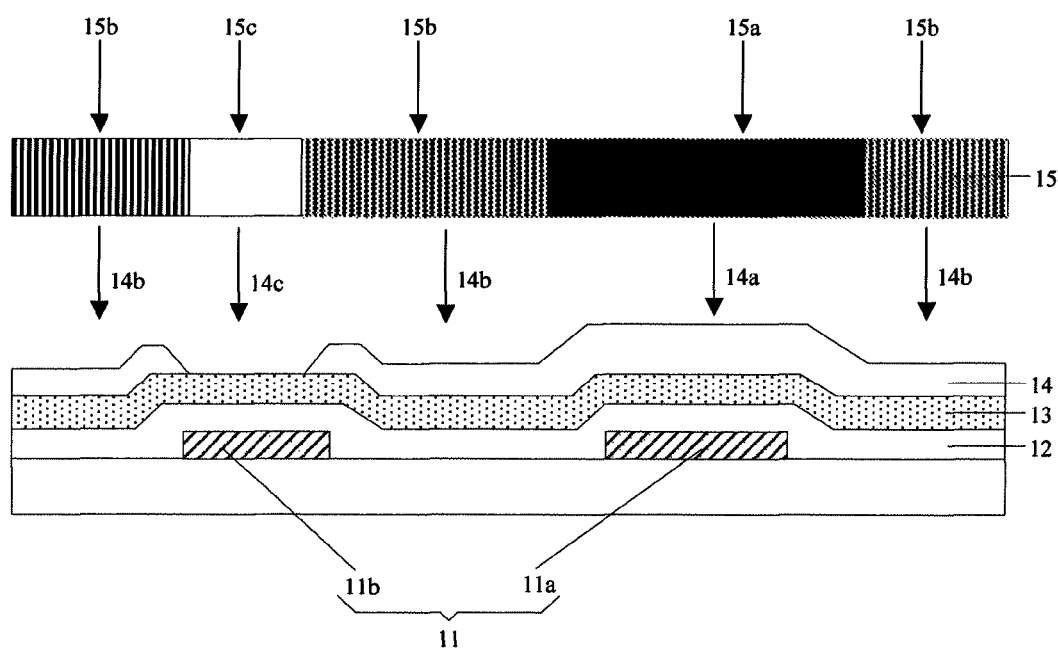

S12, a first gray-tone mask 15 as illustrated in FIG. 4 is used to expose and develop the substrate having the photoresist 14 to form a photoresist-completely-retained region 14a, a photoresist-partially-removed region 14b and a photoresist-completely-removed region 14c.

The photoresist-completely-retained region 14a corresponds to a region of the pattern of the active layer to be formed, the photoresist-completely-removed region 14c corresponds to a region of the via hole to be formed, and the photoresist-partially-removed region 14b corresponds to the remaining region.

As an example, a thickness of the photoresist in the photoresist-partially-removed region 14b is for example 2000 Å~10000 Å. By this means, the process stability may be further improved and process time saved.

Herein, the main principle of the first gray-tone mask 15 is described in the following with reference to FIG. 4.

The first gray-tone mask 15 has light of different intensity to be transmitted in different exposed regions by way of the grating effect, such that the photoresist is selectively exposed and developed. The first gray-tone mask 15 comprises an opaque portion 15a, a semitransparent portion 15b and a transparent portion 15c. After the photoresist 14 is exposed, three regions 14a, 14b, 14c are formed, in which a photoresist-completely-retained region 14a corresponds to the opaque portion 15a of the first gray-tone mask 15, a photoresist-partially-removed region 14b corresponds to the semitransparent portion 15b and a photoresist-completely-removed region 14c corresponds to the transparent portion 15c.

The principle of the first half-tone mask is similar to that of the first gray-tone mask 15 and will not be elaborated here.

The photoresist 14 in all embodiments of the invention is positive photoresist. That is to say, in the gray-tone mask 15, the photoresist-completely-removed region 14c corresponds to the fully exposed region which uses a transmissive material; the photoresist-partially-removed region 14b corresponds to the partially exposed region which uses a semitransmissive material; and the photoresist-completely-retained region 14a corresponds to a non exposed region which uses a non-transmissive material.

Figure 5:
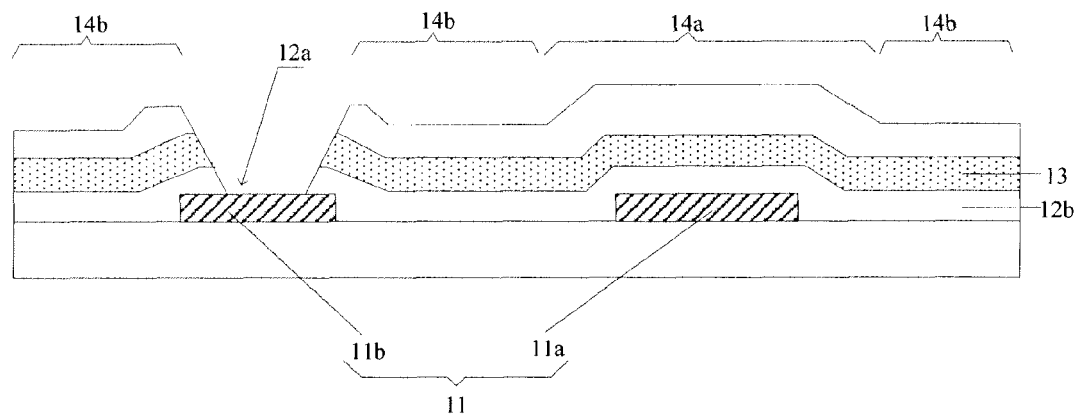

S13, the active layer film and the insulation film in the photoresist-completely-removed region 14c are removed via etching and a pattern of the gate insulation layer 12b having the via hole 12a as illustrated in FIG. 5 is formed.

Figure 6:
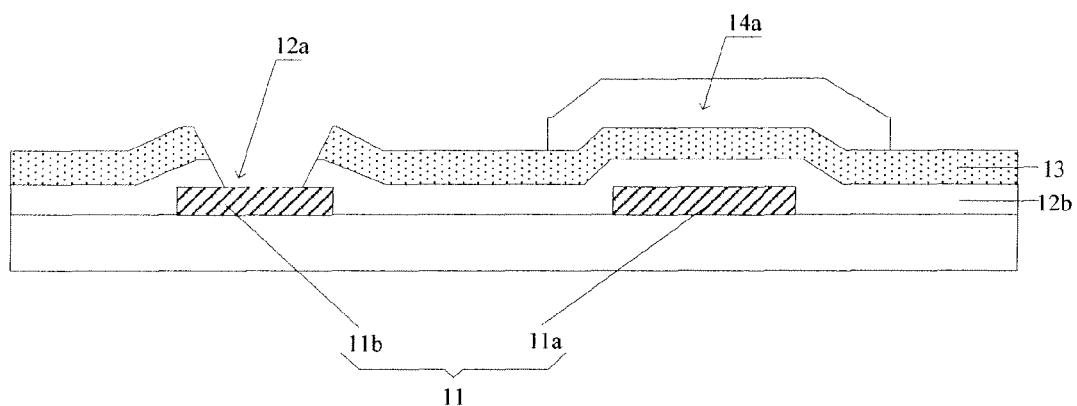

S14, the photoresist in the photoresist-partially-removed region 14b is removed via ashing to form the substrate as illustrated in FIG. 6.

As the photoresist in the photoresist-completely-retained region 14a is thicker than that in the photoresist-partially-removed region 14b, there is still photoresist remained on the substrate in the photoresist-completely-retained region 14a after the photoresist in photoresist-partially-removed region 14b is removed.

Figure 7:
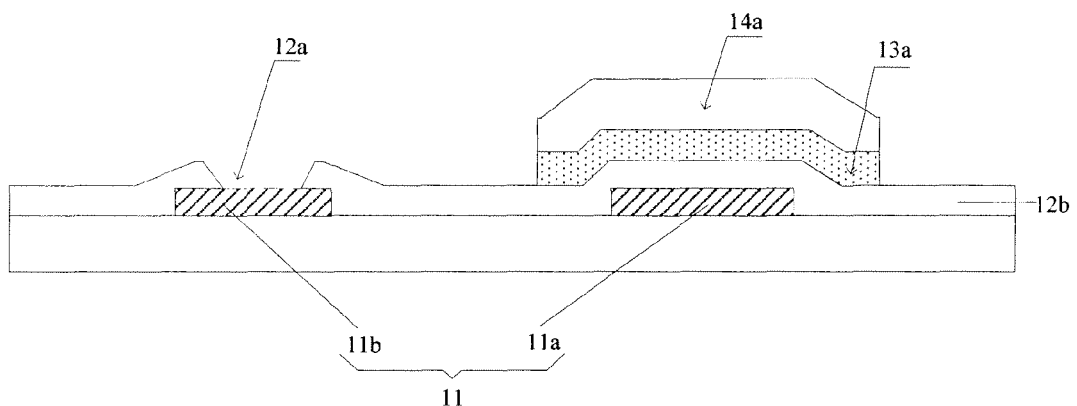

S15, a part of the active layer film exposed above the gate insulation layer 12b is removed via etching and the pattern of the active layer 13a as illustrated in FIG. 7 is formed.

Figure 8:
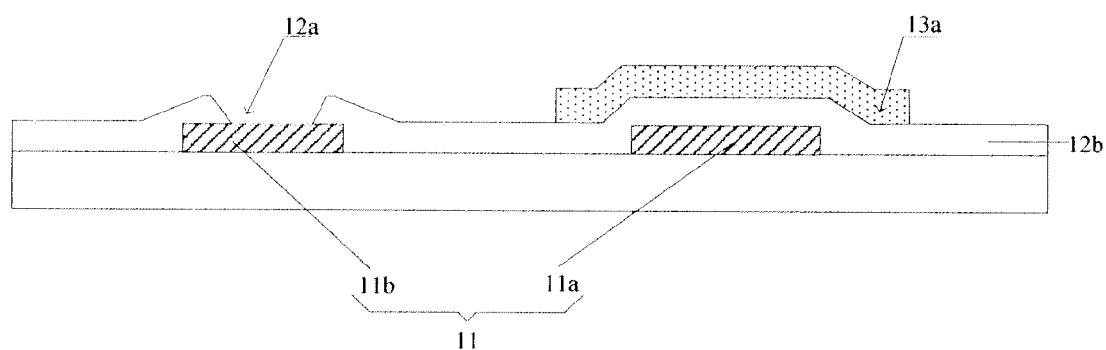

S16, the photoresist in the photoresist-completely-retained region 14a is removed via peeling to form the substrate as illustrated in FIG. 8.

The single patterning process performed through steps S11 to S16 is used to form the pattern of the gate insulation layer 12b having the first via hole 12a and the pattern of the active layer 13a. In comparison with the conventional art which forms the pattern of the gate insulation layer 12b having the via hole 12a and the pattern of the active layer 13a respectively by using two patterning processes, the embodiments of the invention reduces the number of patterning processes, thereby improving the production capacity and reducing the cost.

Figure 9:
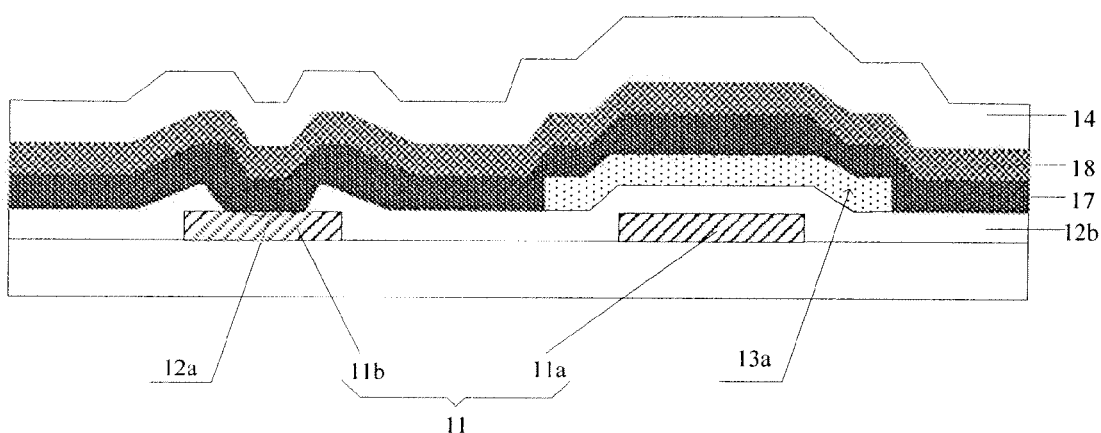
FIGS. 9 to 14 schematically illustrate cross sections of an substrate during the procedure of forming a pattern layer comprising a first electrode and a pattern layer comprising a data line, a source, a drain in accordance with Embodiment 1 of the invention.

S17, a transparent conductive film 17 and a metal film 18 are sequentially formed on the substrate done with step S16, and the photoresist 14 is applied onto the metal film 18, to form the substrate as illustrated in FIG. 9.

As an example, a transparent conductive film layer 17 with a thickness of 100 Å to 1000 Å may be deposited on the whole substrate via CVD, and then a metal film 18 with a thickness of 1000 Å to 7000 Å may be deposited on the transparent conductive film layer 17. Herein the transparent conductive film 17 may be for example an Indium Tin Oxides (ITO) or an Indium Zinc Oxide (IZO) film. Then a layer of photoresist 14 is applied onto the metal film 18.

Figure 10:
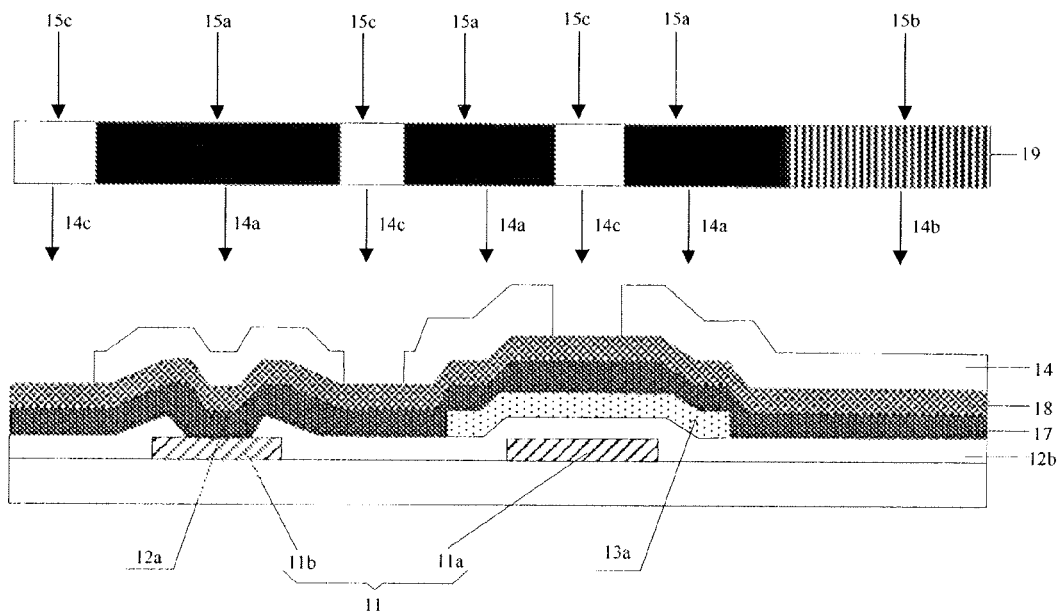

S18, a second gray-tone mask 19 as illustrated in FIG. 10 is used to expose and develop the substrate having the photoresist 14 to form a photoresist-completely-retained region 14a, a photoresist-partially-removed region 14b and a photoresist-completely-removed region 14c.

The photoresist-completely-retained region 14a at least corresponds to a region of the pattern of the data line (not shown), the source 18a and the drain 18b to be formed, the photoresist-partially-removed region 14b at least corresponds to a part of the region of the pattern of the first electrode 17a to be formed, and the photoresist-completely-retained region 14c corresponds to the remaining region comprising a TFT channel region.

Please note that the second gray-tone mask 19 also comprises an opaque portion 15a, a semitransparent portion 15b and a transparent portion 15c. For detail please refer to the description of the first gray-tone mask 15 in S12, which will not be elaborated here. The second gray-tone mask 19 is similar to the first gray-tone mask 15 and will not be elaborated here.

As an example, a thickness of the photoresist in the photoresist-partially-removed region 14b is for example 2000 Å~10000 Å. By this means, the process stability may be further improved and process time saved.

Figure 11:
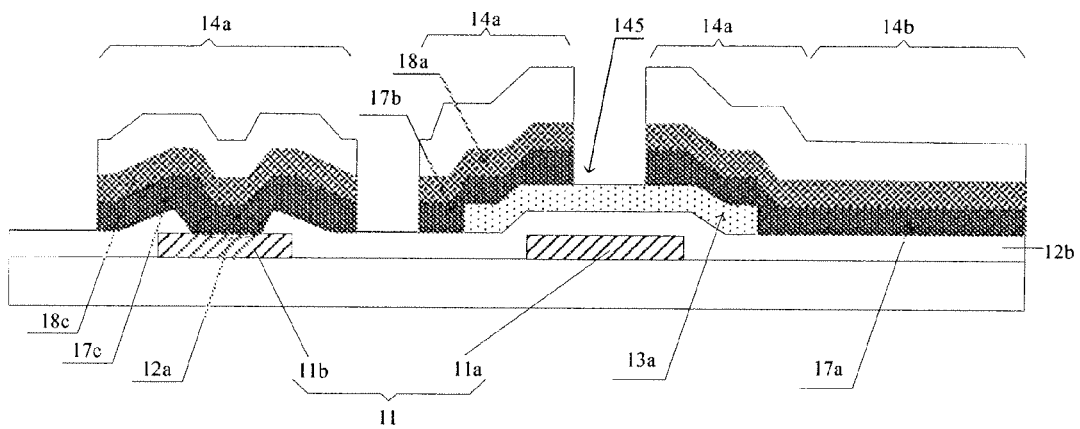

S19, the metal film and the transparent conductive film in the photoresist-completed-removed region 14c is removed via etching as illustrated in FIG. 11, to form the pattern of the data line (not shown) and the source 18a located at both sides of the TFT channel 145, the first transparent conductive pattern 17b and the pattern of the first electrode 17a located under the pattern of the data line and the source 18a, the metal film above the pattern of the first electrode 17a and the second transparent conductive pattern 17c overlaying the first via hole 12a, and the source/drain metal layer retaining pattern 18c located above the second transparent conductive pattern 17c.

Please note that in all embodiments of the invention, the term 'above' is used to indicate the sequence for forming the layers, a layer formed earlier is under a layer formed later and vice versa. As an example, the source/drain metal layer retaining pattern 18c being located above the second transparent conductive pattern 17c means that the second transparent conductive pattern 17c is first formed, and then the source/drain metal layer retaining pattern 18c is formed.

As an example, the metal film and the transparent conductive film in the photoresist-completely-removed region 14c are respectively removed via wet etching.

Figure 12:
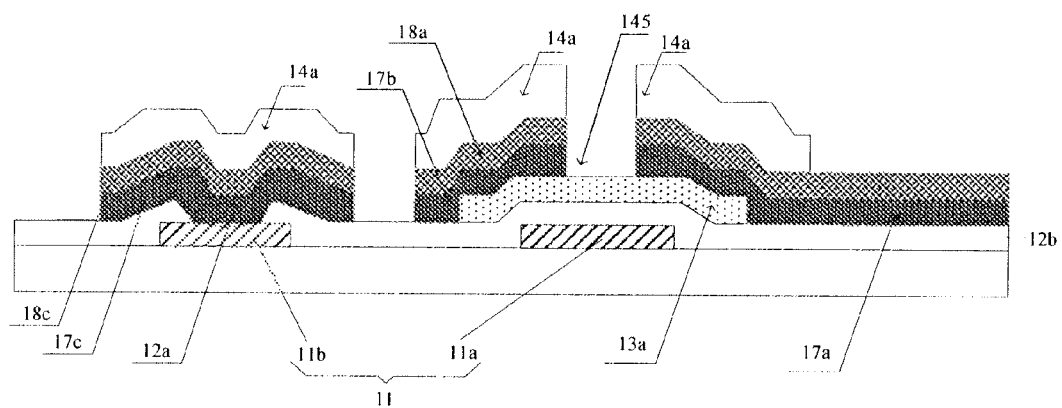

S20, the photoresist in the photoresist-partially-removed region 14b is removed via ashing to form the substrate as illustrated in FIG. 12.

Figure 13:
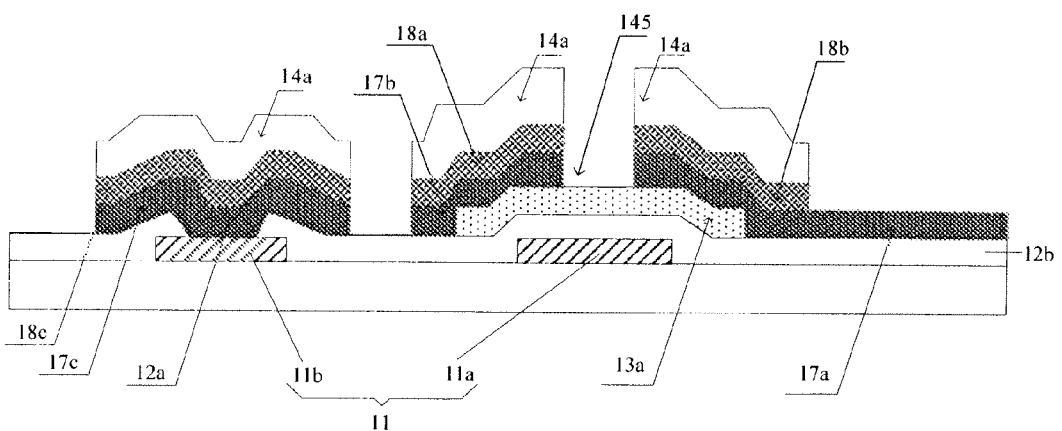

S21, a part of the metal film exposed above the pattern of the first electrode 17a is removed via etching to form the pattern of the drain 18b as illustrated in FIG. 13.

As an example, the part of metal film exposed above the pattern of the first electrode 17a is removed via wet etching.

Figure 14:
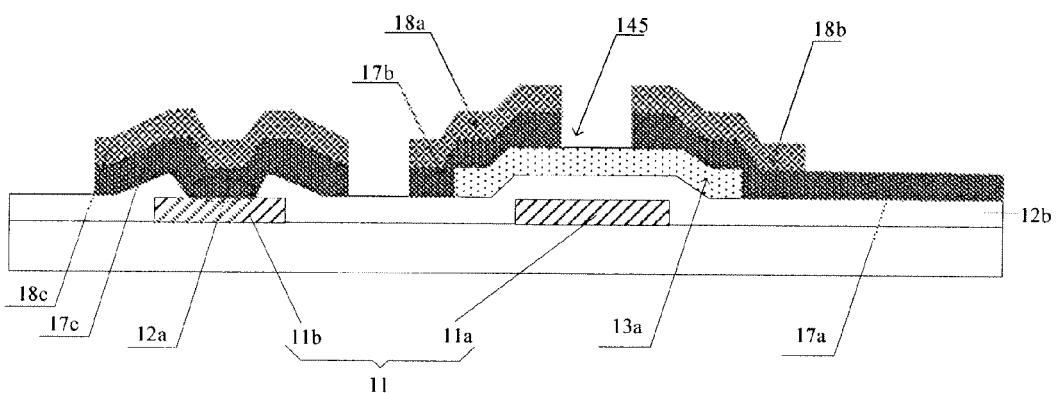

S22, the photoresist in the photoresist-completely-retained region 14a is removed via peeling to form the substrate as illustrated in FIG. 14.

The single patterning process performed through steps S17 to S22 is used to form the pattern layer comprising the first electrode 17a and the pattern layer comprising the data line, the source 18a and the drain 18b. In comparison with the conventional art which forms the pattern of the first electrode 17a and the pattern of the data line, the source 18a and the drain 18b by using two patterning processes respectively, the embodiments of the invention reduces the number of patterning processes, thereby improving the production capacity and reducing the cost.

Furthermore, for the purpose of preventing the conductive films (such as the metal film or the transparent conductive film) being exposed in air and getting oxidized and thus shortening the lifetime of the array substrate, the method may further comprise the following step:

S23, a passivation layer film is fabricated on the substrate done with step S22 and a patterning process is used to form a pattern of a passivation layer 20.

Figure 15:
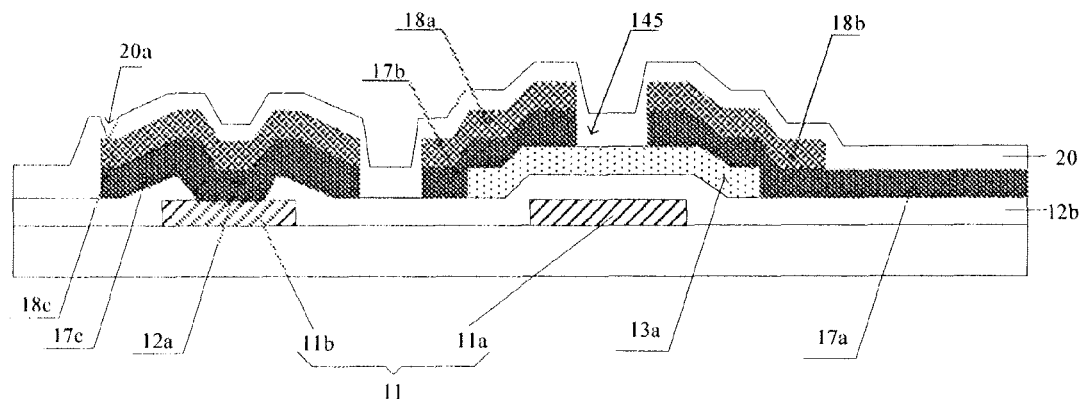
FIG. 15 schematically illustrates a cross section of an array substrate comprising a pattern of a passivation layer in accordance with Embodiment 1 of the invention.

As an example, a protection layer made of for example silicon nitrides or transparent organic resin material with a thickness of for example 1000 Å to 6000 Å may be applied to the whole substrate, and a pattern of the passivation layer 20 with a second via hole 20a as illustrated in FIG. 15 is formed using a single patterning process. The second via hole 20a exposes the source/drain metal layer retaining pattern 18c under the passivation layer 20.

As a drive circuit is needed to drive the gate 11a to realize display, in the embodiment of the invention, the passivation layer 20 with the second via hole 20a is thus needed to electrically connect the drive circuit to the gate connection 11b through the via hole 20a.

Furthermore, the array substrate as provided by the embodiment of the invention may be applied to ADS and Twist Nematic (TN) LCDs. For the ADS technology, the main technical feature is as follows: a multi-dimensional electric field is formed with both an electric field produced at edges of slit electrodes in the same plane and an electric field produced between a slit electrode layer and a plate-like electrode layer, so that liquid crystal molecules at all orientations, which are located directly above the electrodes and between the slit electrodes in a liquid crystal cell, can be rotated, which enhances the work efficiency of liquid crystals and increases the light transmittance. The ADS technology can improve the picture quality of TFT-LCDs and has advantages of high resolution, high transmittance, low power consumption, wide viewing angle, high aperture ratio, low chromatic aberration, being free of push Mura, etc.

Figure 16:
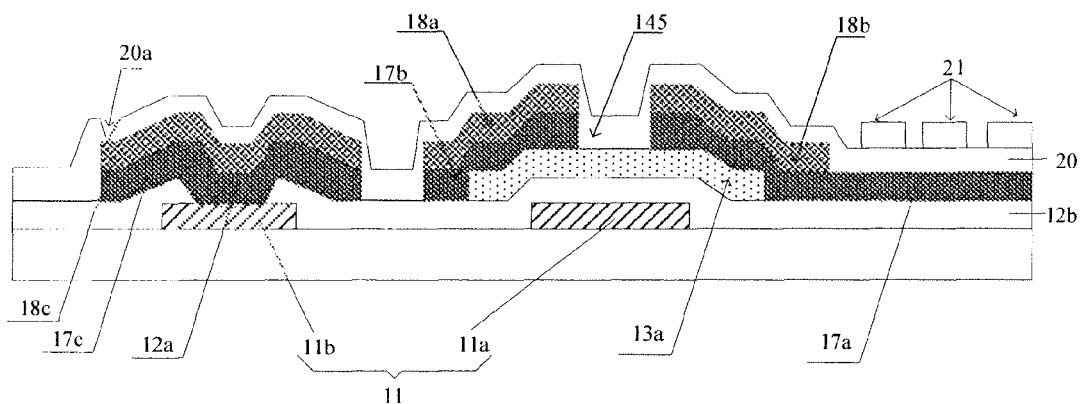
FIG. 16 schematically illustrates a cross section of an array substrate comprising a pattern layer comprising a second electrode in accordance with Embodiment 1 of the invention.

Therefore, the method may further comprise the following step based on step S23:

S24, a further transparent conductive film is formed on the substrate done with step S23, and a patterning process is used to form the pattern layer of the second electrode 21 as shown in FIG. 16.

The embodiment of the invention provides a method for fabricating an array substrate, which forms the pattern of the gate insulation layer 12b having the via hole 12a and the pattern of the active layer 13a using a single patterning process and forms the pattern layer comprising the first electrode 17a and the pattern layer comprising the data line, the source 18a and the drain 18b using a single patterning process. In comparison with the conventional art which forms the pattern of the gate insulation layer 12b having the via hole 12a and the pattern of the active layer 13, and the pattern of the first electrode 17a and the pattern of the data line, the source 18a and the drain 18b respectively by using two patterning processes, the embodiments of the invention reduces the number of patterning processes, thereby improving the production capacity and reducing the cost.

Embodiment 2

Figure 17:
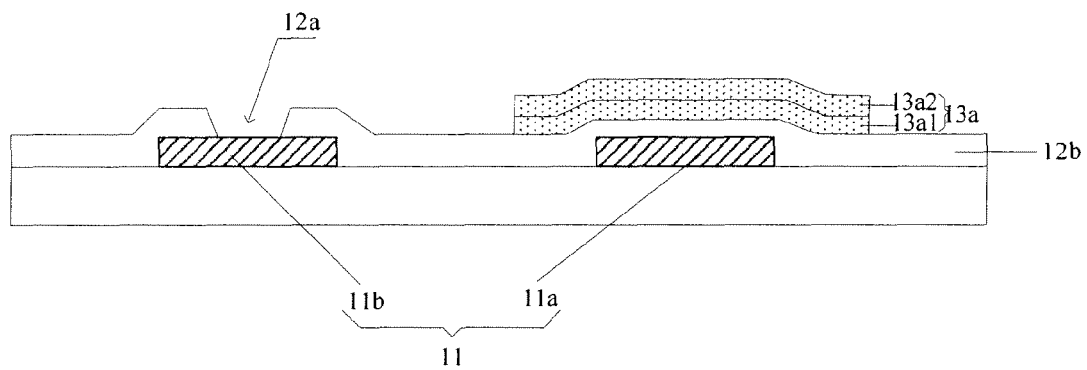
FIGS. 17 to 21 schematically illustrate cross sections of a substrate during the procedure of fabrication in accordance with Embodiment 2 of the invention.
Figure 18:
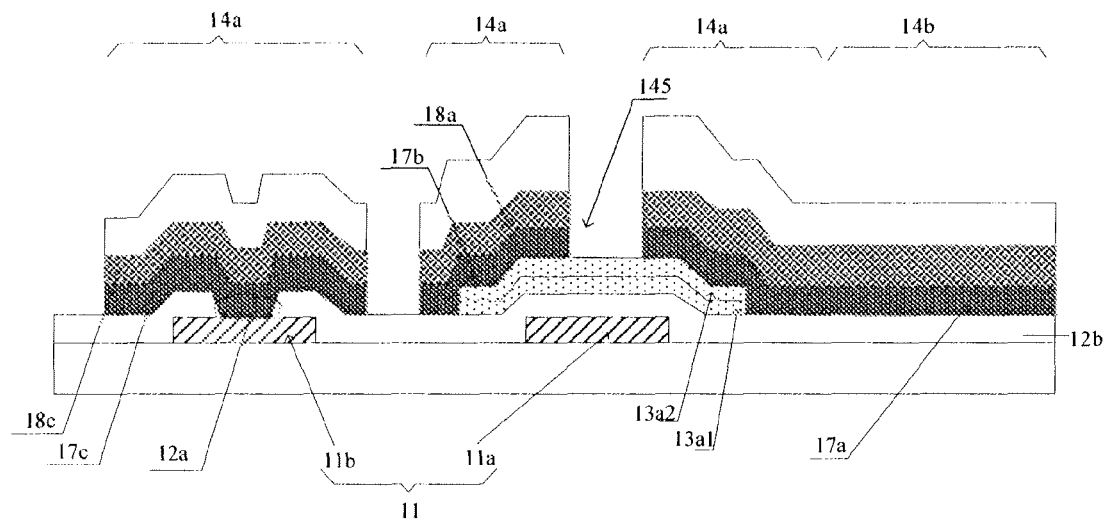

Another method for fabricating an array substrate comprises the following steps:

S30, a metal film is fabricated on a substrate, and a single pattering process is used to form a gate metal layer 11 as illustrated in FIG. 17, where the gate metal layer 11 comprises a pattern of a gate 11a, a gate line (not shown) and a gate connection 11b; an insulation film and an active layer film are fabricated on the substrate having the gate metal layer 11 formed thereon, the active layer film comprises an amorphous silicon film layer and a n+ amorphous silicon disposed on the amorphous silicon film layer, and a single patterning process is used to form the pattern of the gate insulation layer 12 having the via hole 12a and the pattern of the active layer 13a, where the pattern of the active layer 13a comprises an amorphous silicon pattern 13a1 and a n+ amorphous silicon pattern 13a2.

In step S30, the gate metal layer 11 comprising the pattern of the gate 11a, the gate line and the gate connection 11b is formed via a single patterning process, which is the same as step S10 of Embodiment 1. Forming the pattern of the gate insulation layer 12b having the first via hole 12a and the pattern of the active layer 13a via a single patterning process is similar to the procedure of S11 to S16 of Embodiment 1, however, the difference lies in that the active layer film 13 of Embodiment 2 comprises two layers—the amorphous silicon film and the n+ amorphous silicon. Accordingly, the formed pattern of the active layer 13a comprises the amorphous silicon pattern 13a1 and the n+ amorphous silicon pattern 13a2.

S31, upon finishing step S30, a transparent conductive film 17 and a metal film 18 are sequentially formed on the substrate, and a photoresist 14 is applied onto the metal film 18, a second gray-tone mask 19 is used to expose and develop the substrate having the photoresist 14 to form a photoresist-completely-retained region 14a, a photoresist-partially-removed region 14b and a photoresist-completely-removed region 14c (14 not shown in the figure); the metal film and the transparent conductive film in the photoresist-completely-removed region 14c is removed via etching, to form the pattern of the data line (not shown) and the source 18a located at both sides of the TFT channel 145, the first transparent conductive pattern 17b and the pattern of the first electrode 17a located under the pattern of the data line and the source, the metal film above the pattern of the first electrode 17a, the second transparent conductive pattern 17c overlaying the first via hole 12a, and the source/drain metal layer retaining pattern 18c located above the second transparent conductive pattern 17c.

As an example, a thickness of the photoresist in the photoresist-partially-removed region 14b is for example 2000 Å~10000 Å. By this means, the process stability may be further improved and process time saved.

As an example, the metal film and the transparent conductive film in the photoresist completely-removed-region is removed via wet etching.

In step S31, the pattern of the data line (not shown) and the source 18a located at both sides of the TFT channel 145, the first transparent conductive pattern 17b and the pattern of the first electrode 17a located under the pattern of the data line and the source, the metal film above the pattern of the first electrode 17a, the second transparent conductive pattern 17c overlaying the first via hole 12a, and the source/drain metal layer retaining pattern 18c located above the second transparent conductive pattern 17c are formed in the same way as step S17~S19 and will not be elaborated here.

Figure 19:
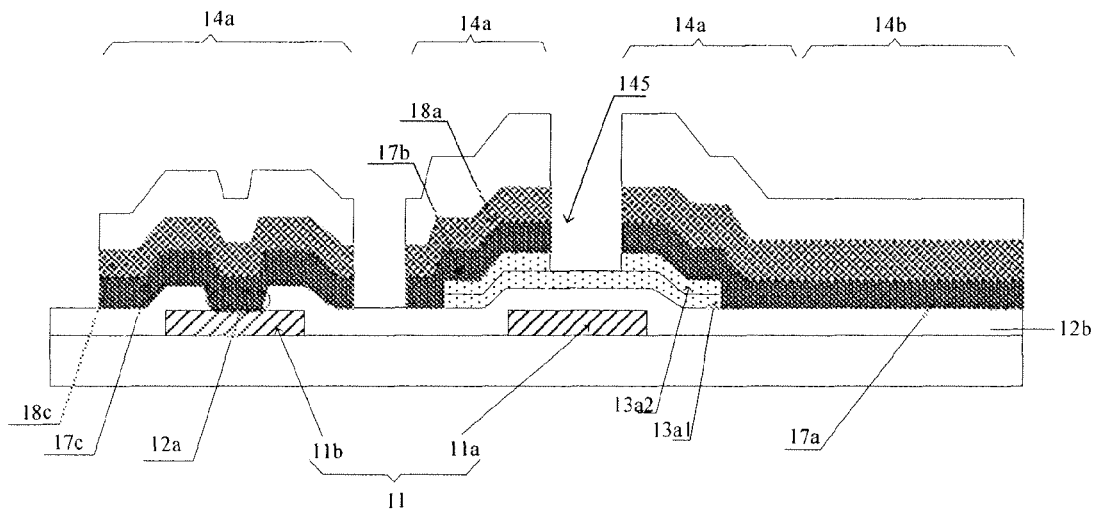

S32, the n+ amorphous silicon pattern 13a2 in the TFT channel 145 region is removed via dry etching to form the substrate as shown in FIG. 19.

Figure 20:
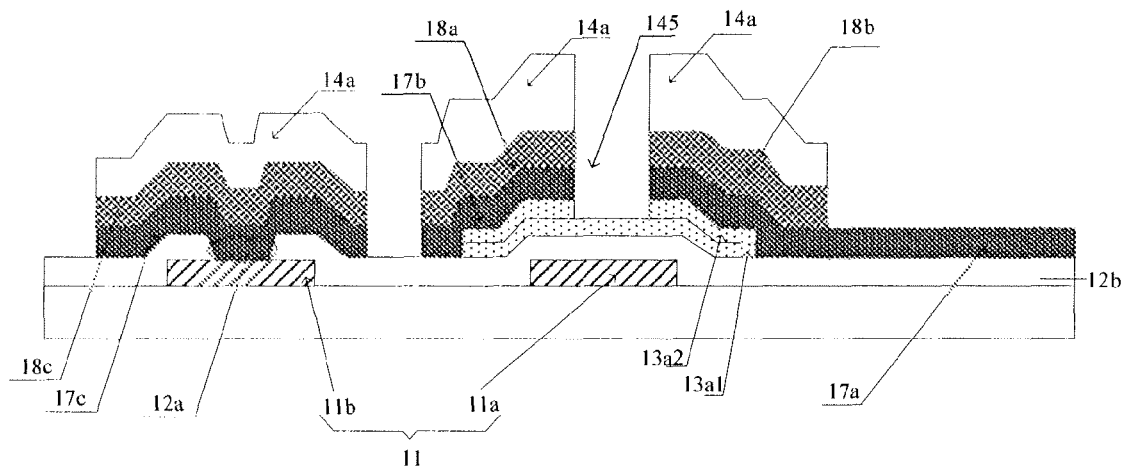

S33, the photoresist in the photoresist-partially-removed region14b is removed via ashing, and a part of the metal film exposed above the pattern of the first electrode 17a is removed via etching to form the pattern of the drain 18b as illustrated in FIG. 20.

As an example, the part of the metal film exposed above the pattern of the first electrode 17a is removed via wet etching.

Figure 21:
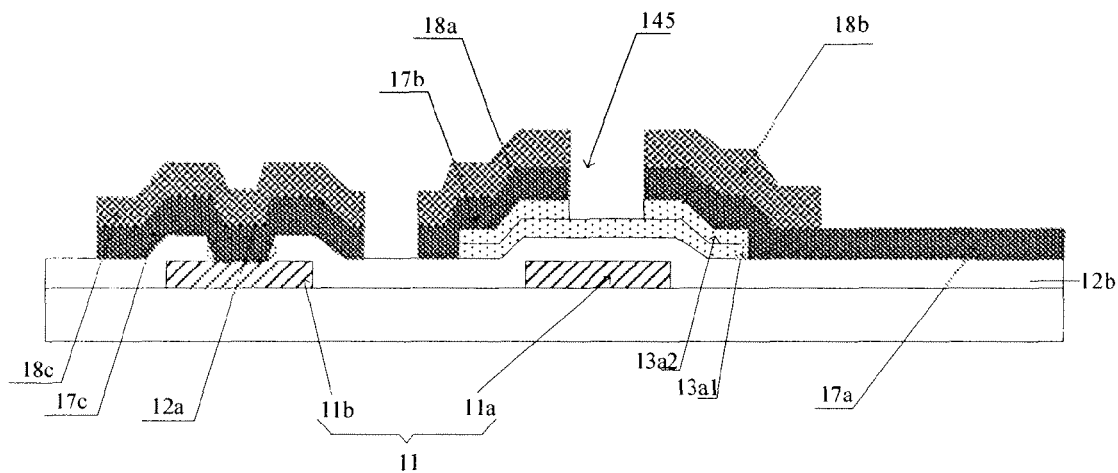

S34, the photoresist in the photoresist-completely-retained region 14a is removed via peeling to form the substrate as illustrated in FIG. 21.

Optionally, the method of the embodiment may further comprise S23~S24 of Embodiment 1, which will not be elaborated here.

In the embodiment of the invention, the sequence of etching is wet etching, wet etching, dry etching, dry etching and wet etching. It can be seen that the first two wet etching may be done in a same reaction chamber, and the next two dry etching may also be done in a same reaction chamber, which may help improving the efficiency of etching.

The embodiment of the invention forms the pattern of the gate insulation layer 12b having the via hole 12a and the pattern of the active layer 13a using a single patterning process and forms the pattern layer comprising the first electrode 17a and the pattern layer comprising the data line, the source 18a and the drain 18b using a single patterning process. In comparison with the conventional art which forms the pattern of the gate insulation layer 12b having the via hole 12a and the pattern of the active layer 13, and the pattern of the first electrode 17a and the pattern of the data line, the source 18a and the drain 18b respectively by using two patterning processes, the embodiments of the invention reduces the number of patterning processes, thereby improving the production capacity and reducing the cost.

Embodiment 3

Figure 22:
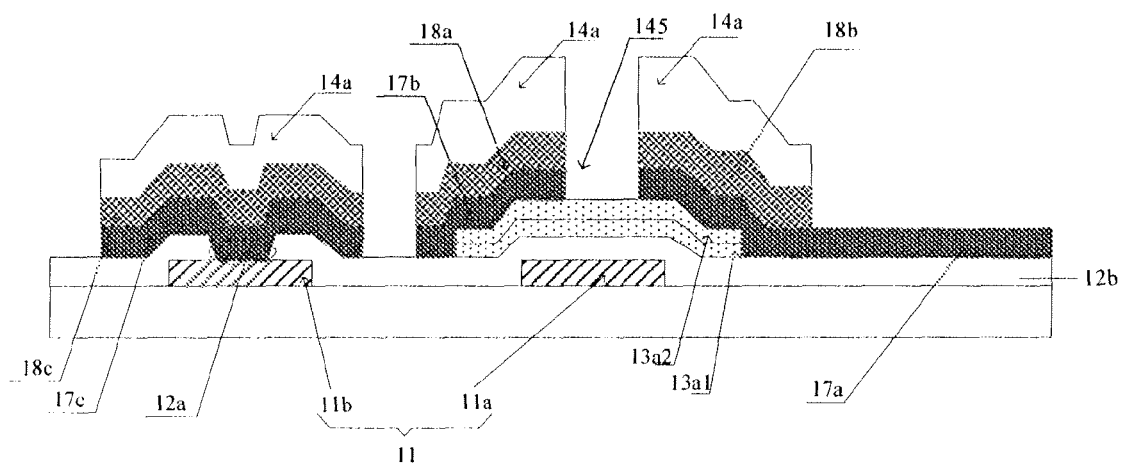
FIG. 22 schematically illustrates an array substrate fabricated with a method in accordance with Embodiment 2 of the invention.

A method for fabricating an array substrate further comprises the following steps in addition to step S30~31 of Embodiment 2:

S40, the photoresist in the photoresist-partially-removed region 14b is removed via ashing, and a part of the metal film exposed above the pattern of the first electrode 17a is removed via etching to form the pattern of the drain 18b as illustrated in FIG. 22.

As an example, the part of the metal film exposed above the pattern of the first electrode 17a is removed via wet etching.

S41, the n+ amorphous silicon pattern 13a2 in the channel region is removed via dry etching to form the substrate as shown in FIG. 20.

S42, the photoresist in the photoresist-completely-retained region 14a is removed via peeling to form the substrate as illustrated in FIG. 21.

It is seen from above that Embodiment 3 differs from Embodiment 2 in that the n+ amorphous silicon pattern 13a2 in the channel 145 region is removed at a different process order. Naturally, Embodiments 2 and 3 may further include the above steps S23~S24, which will not be elaborated here.

What are described above is related to the illustrative embodiments of the disclosure only and not (imitative to the scope of the disclosure; the scopes of the disclosure are defined by the accompanying claims.

What is claimed is:

1. A method for fabricating an array substrate, comprising:
    forming a pattern layer comprising a gate and a gate connection on a substrate;
    sequentially forming an insulation layer film and an active layer film on the substrate, and forming a pattern of a gate insulation layer having a first via hole and a pattern of an active layer through a single patterning process, wherein the first via hole is located above the gate connection;
    sequentially forming a transparent conductive film and a metal film on the substrate, and forming a pattern layer comprising a first electrode and a pattern layer comprising a data line, a source, a drain and a TFT channel through a single patterning process;
    wherein forming the pattern layer comprising the first electrode and the pattern layer comprising the data line, the source, the drain and the TFT channel through a single patterning process comprises:
    applying a photoresist to the metal film;
    exposing and developing the substrate having the photoresist by using a second gray-tone mask or a second half-tone mask to form a photoresist-completely-retained region, a photoresist-partially-removed region and a photoresist-completely-removed region, wherein the photoresist-completely-retained region at least corresponds to a region of the pattern of the data line, the source and the drain to be formed, the photoresist-partially-removed region at least corresponds to a part of the region of the pattern of the first electrode to be formed, and the photoresist-completely-removed region corresponds to the remaining region comprising the TFT channel region;
    removing the metal film and the transparent conductive film in the photoresist-completed-removed region via etching to form the pattern of the data line and the source located at both sides of the TFT channel, a first transparent conductive pattern and the pattern of the first electrode located under the data line and the source, the metal film above the pattern of the first electrode, a second transparent conductive pattern overlaying the first via hole, and a source/drain metal layer retaining pattern located above the second transparent conductive pattern;
    removing the photoresist in the photoresist-partially-removed region via ashing;
    removing a part of the metal film exposed above the pattern of the first electrode via etching to form the pattern of the drain; and
    removing the photoresist in the photoresist-completely-retained region via peeling,
    wherein the first electrode is configured for generating an electric field with a second electrode that is formed on the same substrate,
    wherein a thickness of the photoresist in the photoresist-partially-removed region is 2000 Å to less than 10000 Å.

2. The method of claim 1, further comprising:
    forming a pattern comprising a passivation layer on the substrate having the pattern layer comprising the first electrode and the pattern layer comprising the data line, the source, the drain and the TFT channel formed thereon;
    forming a pattern layer comprising the second electrode on the substrate having the pattern comprising the passivation layer formed thereon.

3. The method of claim 1, wherein forming the pattern of the gate insulation layer having the first via hole and the pattern of the active layer through a single patterning process comprises:
    applying a photoresist to the active layer film;
    exposing and developing the substrate having the photoresist by using a first gray-tone mask or a first half-tone mask to form a photoresist-completely-retained region, a photoresist-partially-removed region and a photoresist-completely-removed region, wherein the photoresist-completely-retained region corresponds to a region of the pattern of the active layer to be formed, the photoresist-completely-removed region corresponds to a region of the first via hole to be formed, and the photoresist-partially-removed region corresponds to the remaining region;
    removing the active layer film and the insulation film in the photoresist-completely-removed region via etching and forming the pattern of the gate insulation layer having the first via hole;
    removing the photoresist in the photoresist-partially-removed region via ashing;
    removing a part of the active layer film exposed above the gate insulation layer via etching and forming the pattern of the active layer; and
    removing the photoresist in the photoresist-completely-retained region via peeling.

4. The method of claim 1, wherein the patterns of the data line, the source and the drain are positioned above the pattern of the gate, and the pattern of the active layer comprises an amorphous silicon pattern and a n+amorphous silicon pattern, the method further comprises the following step after removing the metal film and the transparent conductive film in the photoresist-completed-removed region via etching and before removing the photoresist in the photoresist-partially-removed region via ashing:
    removing the n+ amorphous silicon in the TFT channel region via dry etching.

5. The method of claim 1, wherein the patterns of the data line, the source and the drain are positioned above the pattern of the gate, and the pattern of the active layer comprises an amorphous silicon pattern and a n+ amorphous silicon pattern, the method further comprises the following step after removing a part of the metal film exposed above the pattern of the first electrode via etching and removing the photoresist in the photoresist-partially-removed region via ashing:
    removing the n+ amorphous silicon in the TFT channel region via dry etching.

6. The method of claim 4, wherein removing the metal film and the transparent conductive film in the photoresist-completed-removed region via etching comprises:
- removing the metal film and the transparent conductive film in the photoresist-completed-removed region via wet etching;
- removing a part of the metal film exposed above the pattern of the first electrode via etching comprises:
- removing the part of the metal film exposed above the pattern of the first electrode via wet etching.

7. The method of claim 5, removing the metal film and the transparent conductive film in the photoresist-completed-removed region via etching comprises:
- removing the metal film and the transparent conductive film in the photoresist-completed-removed region via wet etching;
- removing a part of the metal film exposed above the pattern of the first electrode via etching comprises:
- removing the part of the metal film exposed above the pattern of the first electrode via wet etching.

* * * * *